(12) United States Patent
Patel et al.

(10) Patent No.: US 10,903,793 B2
(45) Date of Patent: Jan. 26, 2021

(54) VOLTAGE REGULATORS HAVING REGULATED VOLTAGE OUTPUT IRRESPECTIVE OF INPUT VOLTAGE

(71) Applicant: Intel Corporation, Santa Clara, CA (US)

(72) Inventors: Dhruval J. Patel, Folsom, CA (US); Liyao Miao, Cupertino, CA (US); Matthew Dayley, Plymouth, CA (US)

(73) Assignee: Intel Corporation, Santa Clara, CA (US)

(*) Notice: Subject to any disclaimer, the term of this patent is extended or adjusted under 35 U.S.C. 154(b) by 313 days.

(21) Appl. No.: 15/640,218

(22) Filed: Jun. 30, 2017

(65) Prior Publication Data

US 2019/0006993 A1    Jan. 3, 2019

(51) Int. Cl.
*H03F 1/02* (2006.01)
*H02M 3/04* (2006.01)
*G05F 1/56* (2006.01)
*H03F 3/72* (2006.01)

(52) U.S. Cl.
CPC .............. *H03F 1/0205* (2013.01); *G05F 1/56* (2013.01); *H02M 3/04* (2013.01); *H03F 1/0277* (2013.01); *H03F 3/72* (2013.01); *H03F 2200/129* (2013.01)

(58) Field of Classification Search
CPC ........ H03F 1/0205; H03F 1/0277; H03F 3/72; H03F 2200/129; H02M 3/04; H02M 3/156; H02M 3/158; H02M 2001/0009; H02M 2001/0019; H02M 2001/0025; H02M 2001/0048; G05F 1/56; G05F 1/565; Y02B 70/2466; Y02B 70/16
See application file for complete search history.

(56) References Cited

U.S. PATENT DOCUMENTS

| | | | | |
|---|---|---|---|---|
| 8,461,810 B2* | 6/2013 | Chung | .................. | H02M 3/156 323/222 |
| 2005/0280465 A1* | 12/2005 | Morishita | ............... | G05F 1/465 327/541 |
| 2011/0090014 A1* | 4/2011 | Kocer | ........................ | H03F 3/24 330/296 |
| 2012/0313597 A1* | 12/2012 | Hunter | .................... | G05F 1/575 323/280 |
| 2016/0018834 A1* | 1/2016 | Kronmueller | ........... | G05F 1/468 323/280 |
| 2017/0248981 A1* | 8/2017 | Conte | ..................... | G05F 1/575 |

* cited by examiner

*Primary Examiner* — Matthew V Nguyen
(74) *Attorney, Agent, or Firm* — Alliance IP, LLC

(57) ABSTRACT

Technology for a system operable to regulate an output voltage is described. The system can include an active amplifier configured to amplify an input voltage to produce the output voltage when there is active current consumption at the output voltage of the system. The system can include a standby amplifier configured to switch between amplifying the input voltage for a defined period of time and not amplifying the input voltage for a defined period of time to maintain a desired value for the output voltage of the system.

10 Claims, 10 Drawing Sheets

VOLTAGE REGULATORS HAVING REGULATED VOLTAGE OUTPUT IRRESPECTIVE OF INPUT VOLTAGE

BACKGROUND

A voltage regulator is an electronic device used to automatically maintain a constant output voltage. A voltage regulator can take an input voltage and create a steady and regulated output voltage irrespective of the input voltage. In other words, the voltage regulator can generate a fixed output voltage that remains constant for any changes in the input voltage or load conditions. The output voltage can be at a fixed voltage level or at an adjustable voltage level. This automatic regulation of the output voltage can be achieved using various feedback techniques, such as by using a Zener diode or other feedback topologies. In addition, voltage regulator can be used to regulate alternating current (AC) or direct current (DC) voltages.

Voltage regulators can be utilized for a large variety of applications. For example, voltage regulators can be used in computer power supplies to stabilize a DC voltage used by processors and other components. Voltage regulators can be used to protect electronic appliances from high or low voltage damages. As another example, voltage regulators can be used to control output voltages in automobile alternators and central power station generator plants. In yet another example, in an electric power distribution system, voltage regulators can be installed at a substation or along a distribution line such that customers can receive steady voltages regardless of an amount of power drawn from the distribution line.

BRIEF DESCRIPTION OF THE DRAWINGS

Features and advantages of invention embodiments will be apparent from the detailed description which follows, taken in conjunction with the accompanying drawings, which together illustrate, by way of example, invention features; and, wherein.

Figure 1:
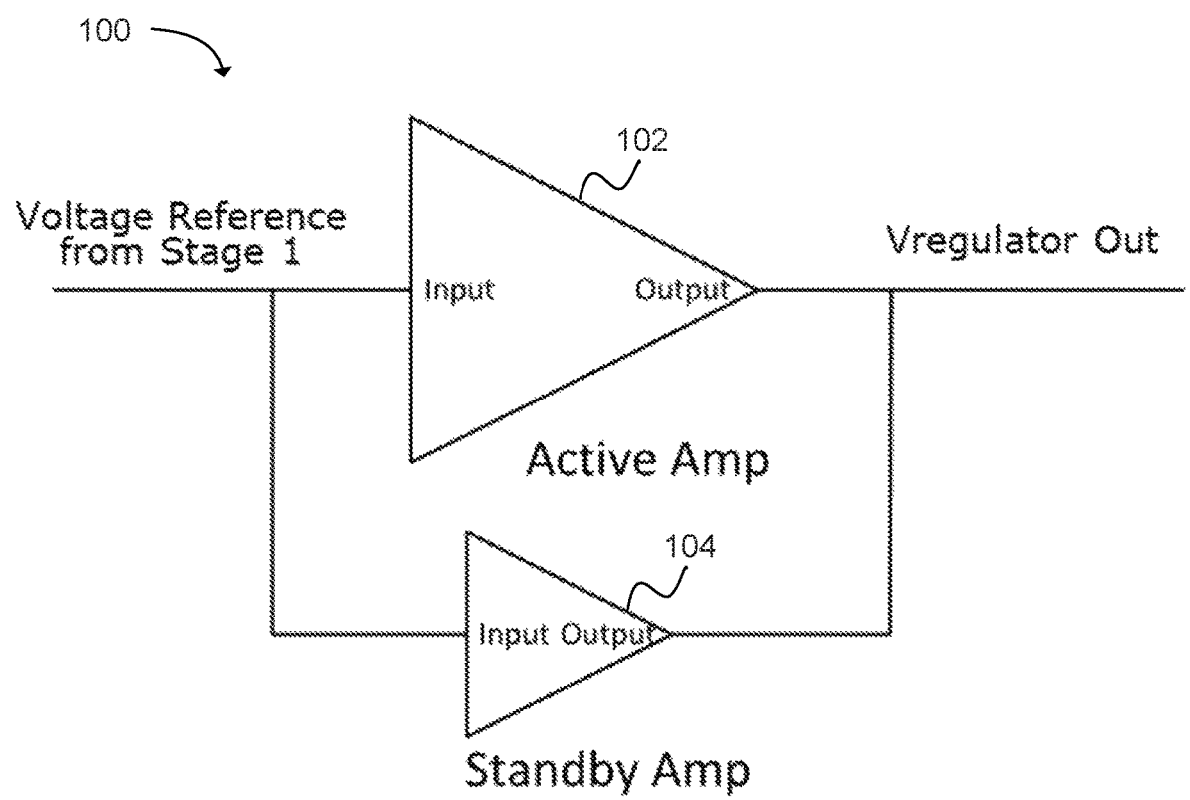
FIG. 1 illustrates a voltage regulator that includes an active amplifier and a standby amplifier in accordance with an example.

Reference will now be made to the embodiments illustrated, and specific language will be used herein to describe the same. It will nevertheless be understood that no limitation on invention scope is thereby intended.

DESCRIPTION OF EMBODIMENTS

Before the disclosed invention embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to provide a thorough understanding of various invention embodiments. One skilled in the relevant art will recognize, however, that such detailed embodiments do not limit the overall inventive concepts articulated herein, but are merely representative thereof.

As used in this written description, the singular forms "a," "an" and "the" include express support for plural referents unless the context clearly dictates otherwise. Thus, for example, reference to "a bit line" includes a plurality of such bit lines.

Reference throughout this specification to "an example" means that a particular feature, structure, or characteristic described in connection with the example is included in at least one embodiment of the present invention. Thus, appearances of the phrases "in an example" or "an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as defacto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of invention embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

EXAMPLE EMBODIMENTS

An initial overview of technology embodiments is provided below and then specific technology embodiments are described in further detail later. This initial summary is intended to aid readers in understanding the technology more quickly, but is not intended to identify key or essential technological features nor is it intended to limit the scope of the claimed subject matter. Unless defined otherwise, all technical and scientific terms used herein have the same meaning as commonly understood by one of ordinary skill in the art to which this disclosure belongs.

In one example, voltage regulators can receive an input voltage and create a steady and regulated output voltage irrespective of the input voltage. In a typical voltage regulator usage model, the voltage regulator can operate in a first state or a second state.

In the first state of the typical voltage regulator usage model, the voltage regulator can be turned on to maintain the constant output voltage. The voltage regulator can operate in the first state when there is activity on a regulated node (i.e., a node that receives an output voltage from the voltage regulator). As an example, the regulated node can be used to read data from a memory or write data to the memory. The activity on the regulated node can indicate an occurrence of an active mode. However, operating in the first state can cause the voltage regulator to continuously consume power.

In the second state of the typical voltage regulator usage model, the voltage regulator can be turned off. For example, the voltage regulator can be turned off when there is no activity on the regulated node. The lack of activity on the regulated node (e.g., a regulated node capable of reading/writing data from/to memory) can indicate an occurrence of a standby mode. The regulated node can go into standby mode when there is no activity for a certain period of time. The voltage regulator does not consume power when turned off. However, operating in the second state can cause the output voltage of the voltage regulator to drift from a desired output voltage level.

In previous solutions, the voltage regulator always operated in the first state, even when there was no activity on the regulated node. In other words, in previous solutions, the voltage regulator was always turned on irrespective of whether the regulated node was in the active mode or the standby mode. As an example, in previous solutions, the voltage regulator was turned on when the regulated node was actively reading/writing data from/to memory and when the regulated node was not currently reading/writing data from/to memory. As a result, this continuous operation of the voltage regulator in the second state even when there was no activity on the regulated node (i.e., when the regulated node was in standby mode) caused the voltage regulator to unnecessarily consume power. In other words, in previous solutions, the voltage regulator unnecessarily consumed power even when there was no active activity at an output of the voltage regulator.

In previous solutions, the voltage regulator was constantly turned on even when there was no active load current. Keeping the voltage regulator continually on to maintain a stable output voltage was wasteful when there was no active load current. On the other hand, turning the voltage regulator off when there was no active load current would cause the output voltage to slowly drift over time due to leakage.

In the present technology, the voltage regulator can be periodically turned on and off when there is no activity on the regulated node (i.e., when the regulated node is in standby mode). In other words, the voltage regulator can be periodically turned on and off when there is no active current consumption at the output voltage of the voltage regulator. The voltage regulator can be turned on and off in accordance with a sample and hold mechanism. For example, sampling can involve turning on the voltage regulator for a defined period of time when there is no activity on the regulated node, and holding can involve turning off the voltage regulator for a defined period of time when there is no activity on the regulated node. The voltage regulator can switch between on and off in accordance with a predefined timing sequence, or alternatively, the voltage regulator can switch between on and off when the output voltage of the voltage regulator drops to below a defined threshold.

On the other hand, the voltage regulator can continually remain on when there is activity on the regulated node. In other words, the voltage regulator can continually remain on when there is active current consumption at the output voltage of the voltage regulator.

In one example, when there is no activity at the regulated node (i.e., when the regulated node is in standby mode), the voltage regulator can be turned off for a defined period of time to save power, but the voltage regulator can periodically be turned on for a defined period of time to counteract any non-active current (e.g., leakage or noise) that has changed the output voltage when the voltage regulator is turned off. As a result, the output voltage can be at or near a desired value for the output voltage at all times, and there can be no or minimal performance degradation even though the voltage regulator is only turned on for limited periods of time when there is no activity on the regulated node. This solution can reduce power consumption at the voltage regulator while maintaining a similar speed and accuracy performance as compared to an active mode of the voltage regulator (i.e., when the voltage regulator is continually turned on because there is activity at the regulated node). In this solution, the voltage regulator can consume less power since the voltage regulator is only turned on for limited periods of time when there is no activity on the regulated node.

FIG. 1 illustrates a voltage regulator 100 operable to regulate an output voltage. The voltage regulator 100 can include an active amplifier 102 and a standby amplifier 104. The voltage regulator 100 can receive an input voltage. The input voltage can be provided to the active amplifier 102 and/or the standby amplifier 104 to produce the output voltage. The output voltage can be a regulated, stable output voltage regardless of fluctuations in the input voltage.

In one example, the voltage regulator 100 can provide the output voltage to a regulated node (not shown). In one example, the regulated node can be a controller that is configured to receive the regulated, stable output voltage from the voltage regulator 100, and then use the output voltage to perform various operations. For example, the regulated node can utilize the output voltage from the voltage regulator 100 to read data from a memory (not shown) or write data to the memory. Therefore, the voltage regulator 100 can be included in a memory device (not shown), but this is not intended to be limiting, as the voltage regulator 100 can be used in any number of types of integrated circuits.

In one example, the regulated node can be active or in standby. When active, the regulated node can be actively performing operations (e.g., reading/writing data from/to memory). When the regulated node is active, the regulated node can be utilizing the output voltage from the voltage regulator 100. In other words, when the regulated node is active, there is active current consumption at the output voltage of the voltage regulator 100. Alternatively, in standby, the regulated node may not be actively performing operations (e.g., reading/writing data from/to memory). The regulated node may transition into standby after not performing any read or write operations for a defined period of time. When the regulated node is in standby, the regulated node is not utilizing the output voltage from the voltage regulator 100. In other words, when the regulated node is in standby, there is no active current consumption at the output voltage of the voltage regulator 100.

In one configuration, the active amplifier 102 can amplify the input voltage to produce the output voltage when there is active current consumption at the output voltage of the voltage regulator 100. In other words, the active amplifier 102 can amplify the input voltage to produce the output voltage when a regulated node that is capable of receiving the output voltage from the voltage regulator 100 is active (e.g., the regulated node can be actively using the output voltage to read/write data from/to memory). In addition, the active amplifier 102 may not amplify the input voltage when there is no active current consumption at the output voltage of the voltage regulator 100. Thus, the active amplifier 102 can amplify the input voltage to produce the output voltage when there is an active load current at the output voltage of the voltage regulator 100, and the active amplifier may not amplify the input voltage to produce the output voltage when there is no active load current at the output voltage of the voltage regulator 100.

In one configuration, the standby amplifier 104 can switch between amplifying the input voltage for a defined period of time and not amplifying the input voltage for a defined period of time to maintain a desired value for the output voltage of the voltage regulator 100. The standby amplifier 104 can switch between amplifying the input voltage for the defined period of time and not amplifying the input voltage for the defined period of time irrespective of whether there is active current consumption at the output voltage of the voltage regulator 100. In other words, the standby amplifier 104 can switch between amplifying and not amplifying the input voltage regardless of whether there is active current consumption at the output voltage of the voltage regulator 100 (e.g., the regulated node is active and utilizes the output voltage to read/write data from/to memory) or no active current consumption at the output voltage of the voltage regulator 100 (e.g., the regulated node is in standby and does not utilize the output voltage to read/write data from/to memory). In other words, the active amplifier 102 can be inactive when there is no active current consumption at the output voltage of the voltage regulator 100 and the standby amplifier 104 can be active when the active amplifier 102 is active or inactive.

In one configuration, the standby amplifier 104 can switch between amplifying the input voltage for the defined period of time and not amplifying the input voltage for the defined period of time in accordance with a predefined timing sequence. The predefined timing sequence can define the period of time to amplify the input voltage and the period of time to not amplify the input voltage. In addition, the standby amplifier 104 can switch between amplifying the input voltage for the defined period of time and not amplifying the input voltage for the defined period of time using a sample and hold mechanism. For example, sampling can involve turning amplifying the input voltage for the defined period of time, and holding can involve not amplifying the input voltage for the defined period of time.

In one example, the standby amplifier 104 can amplify (or sample) the input voltage for the defined period of time to increase the input voltage to obtain a desired value of the output voltage. The standby amplifier 104 may not amplify (or hold) the input voltage for the defined period of time to save power in the voltage regulator 100. Since the output voltage can drift when the input voltage is not amplified for the defined period of time, the input voltage can be amplified (or sampled) for the defined period of time to increase the input voltage back to the desired value of the output voltage. In this example, the standby amplifier 104 can switch between amplifying and not amplifying the input voltage in accordance with the predefined timing sequence regardless of whether or not the active amplifier 102 is amplifying the input voltage.

In one configuration, the standby amplifier 104 can switch between amplifying the input voltage for the defined period of time and not amplifying the input voltage for the defined period of time when the output voltage of the voltage regulator 100 drops to below a defined threshold. For example, the standby amplifier 104 may initially be not amplifying (or holding) the input voltage. After a certain period of time, the output voltage can drift to below the defined threshold. At this point, the standby amplifier 104 can start amplifying (or sampling) the input voltage, thereby increasing the output voltage to desired value. The period of time that it takes before the standby amplifier 104 starts amplifying (or sampling) the input voltage can depend on a rate of leakage. The period of time before the standby amplifier 104 starts amplifying (or sampling) can be extended when there is more capacitance than leakage, which can result in the output voltage being steady for an increased period of time. After the output voltage is back to the desired value, the standby amplifier 104 can resume not amplifying the input voltage, and so on. Therefore, in this example, the standby amplifier 104 can switch between amplifying and not amplifying the input voltage based on the output voltage in relation to the defined threshold.

In one example, each voltage regulator on an integrated circuit can have its own timing sequence for amplifying and not amplifying the input voltage. In other words, standby amplifiers in different voltage regulators can follow different timing sequences for sampling and holding. For example, the timing sequence can depend on an amount of leakage for a particular voltage regulator and an amount of time for the output voltage to go down to the defined threshold. The rate of leakage or voltage drift can be different for different voltage regulators. Therefore, in one example, the timing sequence can vary for different voltage regulators.

In one example, the standby amplifier 104 can amplify the input voltage for the defined period of time to mitigate current leakage that has reduced the output voltage of the voltage regulator 100 when the active amplifier is inactive. In another example, the standby amplifier 104 can switch between amplifying the input voltage for the defined period of time and not amplifying the input voltage for the defined period of time to reduce a power consumption of the voltage regulator 100.

In one configuration, the active amplifier 102 can apply a gain to the input voltage and the standby amplifier 104 can apply a gain to the input voltage. In one example, the gain of the active amplifier 102 can be greater than or less than the gain of the standby amplifier 104. In addition, the gain of the active amplifier 102 can have a higher performance as compared to the gain of the standby amplifier 104 with respect to a lower response time and a lower voltage drop.

In one configuration, the active amplifier 102 can be considered a first amplifier and the standby amplifier 104 can be considered a second amplifier. The first amplifier can amplify an input voltage to produce an output voltage when there is active current consumption at an output voltage of a voltage regulator. The second amplifier can switch between amplifying the input voltage for a defined period of time and not amplifying the input voltage for a defined period of time to maintain a desired output voltage at the voltage regulator. In one example, the second amplifier can switch between amplifying the input voltage for the defined period of time and not amplifying the input voltage for the defined period of time irrespective of whether there is active current consumption at the output voltage of the voltage regulator. In another example, the first amplifier may not amplify the input voltage when there is no active current consumption at the output voltage of the voltage regulator. In yet another example, the first amplifier can be inactive when there is no active current consumption at the output voltage of the voltage regulator and the second amplifier can be active when the first amplifier is active or inactive.

In one configuration, when the active amplifier 102 is considered the first amplifier and the standby amplifier 104 is considered the second amplifier, the second amplifier can switch between amplifying the input voltage for the defined period of time and not amplifying the input voltage for the defined period of time in accordance with a predefined timing sequence, or alternatively, the second amplifier can switch between amplifying the input voltage for the defined period of time and not amplifying the input voltage for the defined period of time when the output voltage of the voltage regulator drops to below a defined threshold. In one example, the second amplifier can amplify the input voltage for the defined period of time to mitigate current leakage that has reduced the output voltage of the voltage regulator when the first amplifier is inactive, and the second amplifier can switch between amplifying the input voltage for the defined period of time and not amplifying the input voltage for the defined period of time to reduce a power consumption of the voltage regulator. In another example, a gain of the first amplifier is greater than or less than a gain of the second amplifier.

Figure 2:
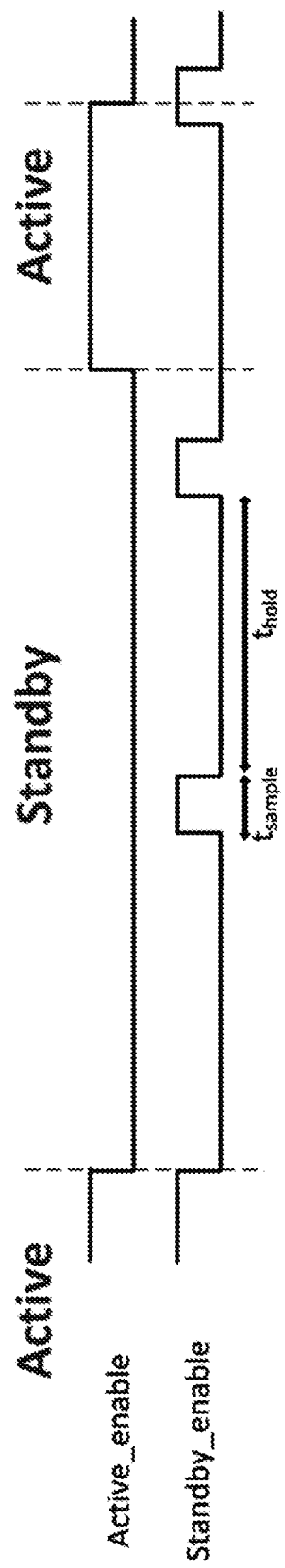
FIG. 2 illustrates timing diagrams for an active amplifier in a voltage regulator and a standby amplifier in the voltage regulator in accordance with an example.

FIG. 2 illustrates exemplary timing diagrams for an active amplifier in a voltage regulator and a standby amplifier in the voltage regulator. With respect to the active amplifier, the active amplifier can initially amplify an input voltage to the voltage regulator. The active amplifier can amplify the input voltage when there is active current consumption at an output voltage of the voltage regulator. The active amplifier can be turned on when the input voltage is being amplified. After a certain period of time, the active amplifier can start to not amplify the input voltage. For example, the active amplifier may not amplify the input voltage when there is no active current consumption at an output voltage of the voltage regulator. The active amplifier can be turned off when the input voltage is not being amplified. After a certain period of time, when active current consumption resumes at the output voltage of the voltage regulator, the active amplifier can continue amplifying the input voltage again.

With respect to the standby amplifier, the standby amplifier can periodically amplify the input voltage to the voltage regulator for a defined period of time a ($t_{sample}$). During the defined period of time a ($t_{sample}$), the standby amplifier can amplify the input voltage regardless of whether or not there is active current consumption at the output voltage of the voltage regulator. The standby amplifier can be turned on to recharge the output voltage to a desired value during the defined period of time a ($t_{sample}$). After the defined period of time ($t_{sample}$), the standby amplifier may not amplify the input voltage for a defined period of time ($t_{hold}$). During the defined period of time ($t_{hold}$), the standby amplifier may not amplify the input voltage regardless of whether or not there is active current consumption at the output voltage of the voltage regulator. The standby amplifier can be turned off during the defined period of time ($t_{hold}$), and the output voltage can slowly leak or reduce during this time. The standby amplifier can periodically amplify and not amplify (i.e., sample and hold) the input voltage to save power, while still maintaining the desired value for the output voltage (or keeping the output voltage within a certain range of values).

In one example, the standby amplifier can periodically amplify and not amplify (i.e., sample and hold) the input voltage in accordance with a defined timing sequence. In addition, the standby amplifier can periodically amplify and not amplify regardless of whether the active amplifier is amplifying or not amplifying (i.e., regardless of whether the active amplifier is turned on or off). Alternatively, the standby amplifier can periodically amplify (or sample) the input voltage only when the active amplifier is not amplifying the input voltage (i.e., when the active amplifier is turned off).

In one example, the active amplifier can amplify the input voltage during an active mode of the voltage regulator, and the active amplifier may not amplify the input voltage during a standby mode of the voltage regulator. In another example, the standby amplifier can periodically switch between amplifying the input voltage and not amplifying the input voltage regardless of whether the voltage regulator is in active mode or standby mode.

Figure 3:
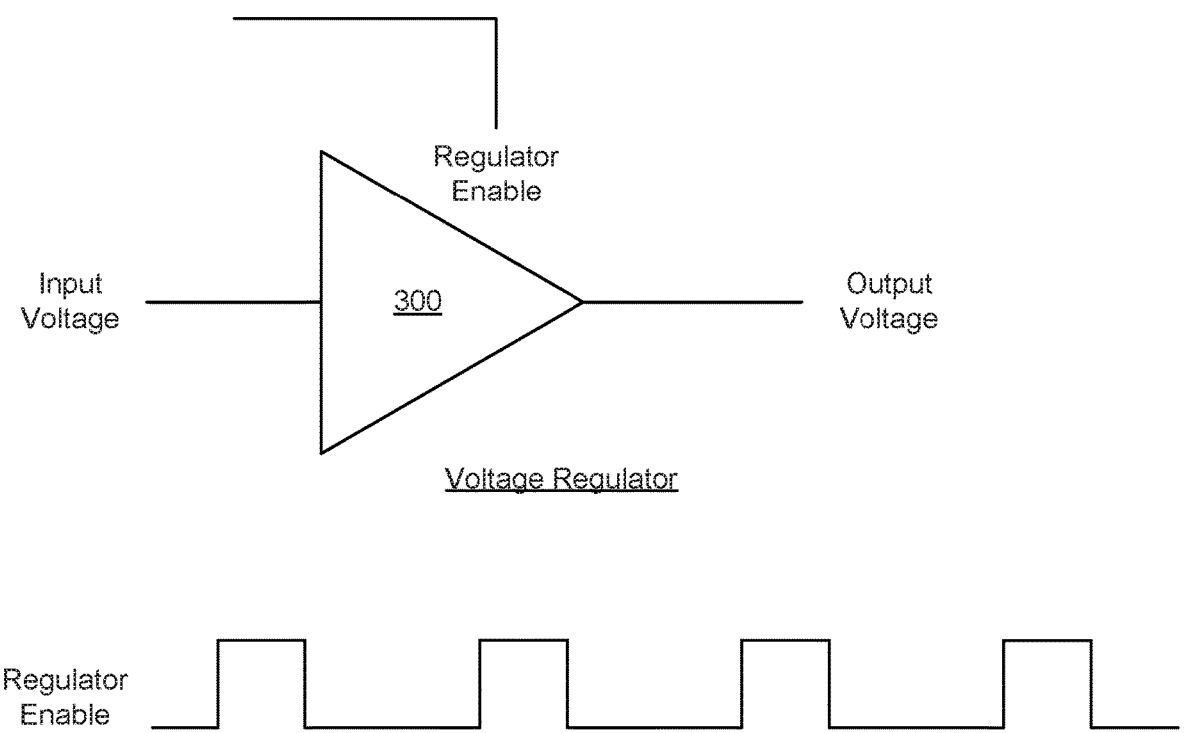
FIG. 3 illustrates a voltage regulator in accordance with an example.

FIG. 3 illustrates an exemplary voltage regulator 300. The voltage regulator 300 can receive an input voltage and produce an output voltage. The output voltage can be a regulated, stable output voltage regardless of fluctuations in the input voltage. In one example, the voltage regulator 300 can provide the output voltage to a regulated node (not shown). In one example, the regulated node can be a controller that is configured to receive the regulated, stable output voltage from the voltage regulator 300, and then use the output voltage to perform various operations. For example, the regulated node can utilize the output voltage from the voltage regulator 300 to read data from a memory (not shown) or write data to the memory. Therefore, the voltage regulator 300 can be included in a memory device (not shown), as well as other types of devices.

In one configuration, the voltage regulator 300 can determine when there is no active current consumption at the output voltage of the voltage regulator 300. In other words, the voltage regulator 300 can determine when a regulated node that is capable of receiving the output voltage from the voltage regulator 300 is inactive (e.g., when a regulated node that uses the output voltage to read/write data from/to memory has become inactive). The voltage regulator 300 can switch between being turned off for a defined period of time and being turned on for a defined period of time when there is no active current consumption at the output voltage of the voltage regulator 300, thereby maintaining a desired value for the output voltage of the voltage regulator 300. The voltage regulator 300 can be turned on for the defined period of time to mitigate current leakage that has reduced the output voltage of the voltage regulator 300 when the voltage regulator 300 is turned off for the defined period of time. In addition, the voltage regulator 300 can be switched between on and off for the respective periods of time when there is no active current consumption at the output voltage of the voltage regulator 300 to reduce a power consumption of the voltage regulator 300.

In one example, the voltage regulator 300 can switch between being turned off for the defined period of time and being turned on for the defined period of time when there is no active current consumption at the output voltage of the voltage regulator in accordance with a predefined timing sequence. In other words, the voltage regulator 300 can be turned on for the defined period of time in accordance with the predefined timing sequence, and then turned off for the defined period of time in accordance with the predefined timing sequence, and so on. Alternatively, the voltage regulator 300 can switch between being turned off for the defined period of time and being turned on for the defined period of time when the output voltage of the voltage regulator 300 drops to below a defined threshold. In other words, the voltage regulator 300 can be turned off and when the output voltage of the voltage regulator 300 drops to below the defined threshold, the voltage regulator 300 can be turned back on until the output voltage reaches a desired value, at which point the voltage regulator 300 can be turned back off, and so on.

In one example, the voltage regulator 300 can determine when there is active current consumption at the output voltage of the voltage regulator 300. In other words, the voltage regulator 300 can determine when a regulated node that is capable of receiving the output voltage from the voltage regulator 300 is active (e.g., when a regulated node is actively using the output voltage to read/write data from/to memory). The voltage regulator 300 can be turned on when there is active current consumption at the output voltage of the voltage regulator 300.

In one example, the voltage regulator 300 can be turned on while there is active current consumption at the output voltage of the voltage regulator 300 in accordance with an active mode of the voltage regulator 300. In addition, the voltage regulator 300 can switch from being turned off for the defined period of time and being turned on for the defined period of time when there is no active current consumption at the output voltage of the voltage regulator 300 in accordance with a standby mode of the voltage regulator 300.

Figure 4:
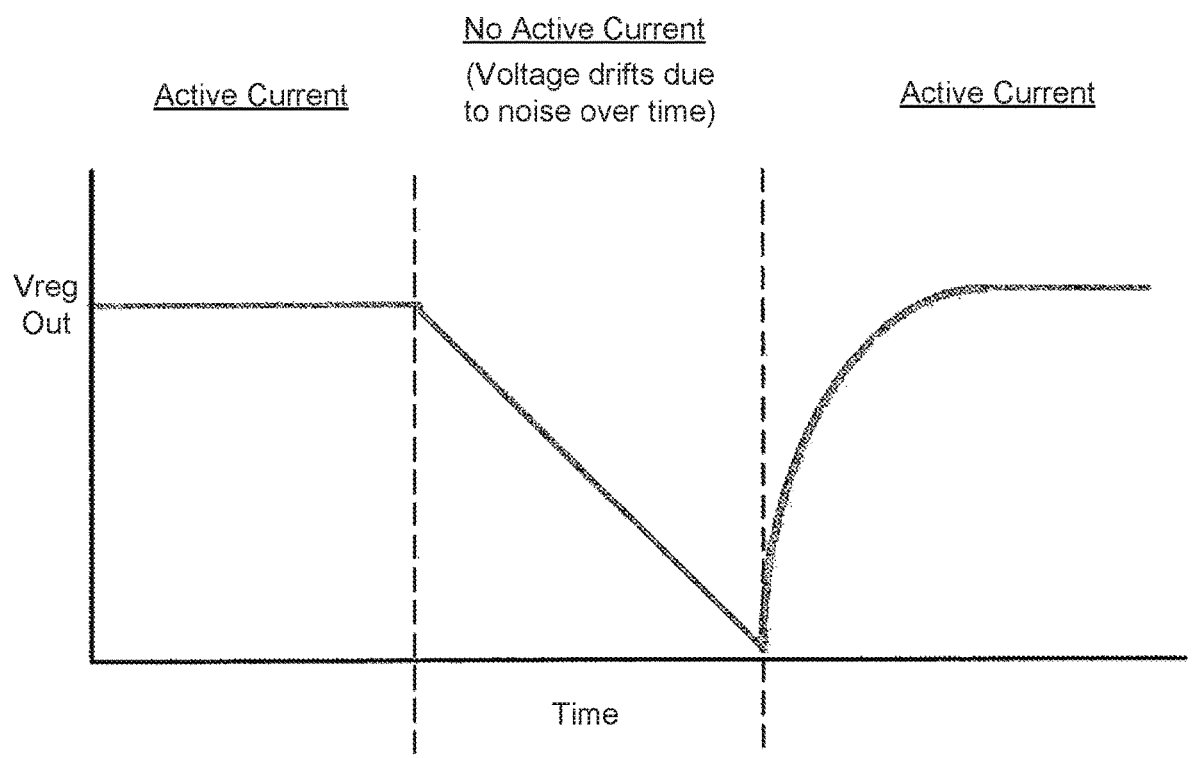
FIG. 4 illustrates an output voltage of a voltage regulator when there is active current consumption at the output voltage versus no active current consumption at the output voltage in accordance with an example.

FIG. 4 illustrates an exemplary output voltage (Vreg Out) of a voltage regulator. When the voltage regulator is turned on and there is active current consumption at the output voltage of the voltage regulator, the output voltage can be stable and constant. After a first period of time, there can be no active current consumption at the output voltage of the voltage regulator, at which point the voltage regulator can be turned off. In a specific example, when the voltage regulator is turned off, an active amplifier and a standby amplifier in the voltage regulator can be turned off. During this time, the output voltage can drift due to leakage and noise over time. After a second period of time, the voltage regulator can be turned back on when there is active current consumption at the output voltage of the voltage regulator. However, since the output voltage previously reduced when the voltage regulator was turned off, it will take a relatively longer period of time before the output voltage can become a stable, regulated output voltage.

Figure 5:
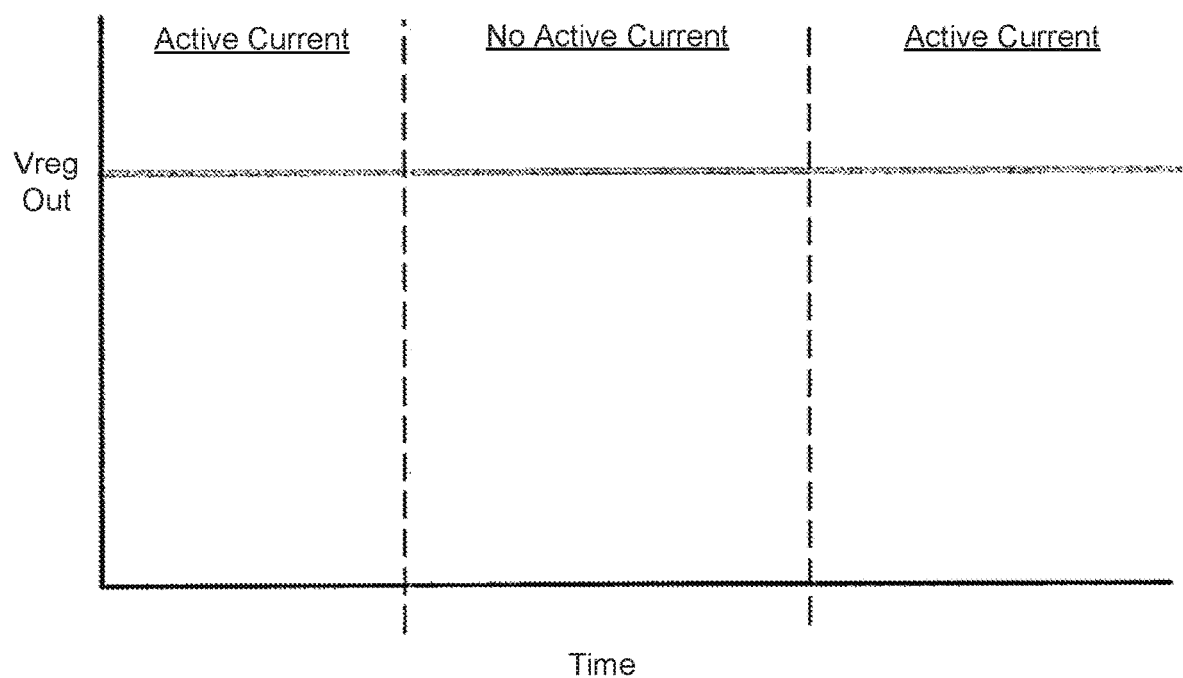
FIG. 5 illustrates an output voltage of a voltage regulator when there is active current consumption at the output voltage versus no active current consumption at the output voltage in accordance with an example.

FIG. 5 illustrates an exemplary output voltage (Vreg Out) of a voltage regulator. When the voltage regulator is turned on and there is active current consumption at the output voltage of the voltage regulator, the output voltage can be stable and constant. After a first period of time, there can be no active current consumption at the output voltage of the voltage regulator. However, the voltage regulator can remain on, so the output voltage can remain constant. In a specific example, when the voltage regulator is turned on, an active amplifier in the voltage regulator can be turned off and a standby amplifier in the voltage regulator can be turned on. After a second period of time, the voltage regulator can be turned back on when there is active current consumption at the output voltage of the voltage regulator. Again, the voltage regulator can continue to remain on, thereby producing the stable, regulated output voltage. In this example, keeping the voltage regulator always on can consume an undue amount of power.

Figure 6:
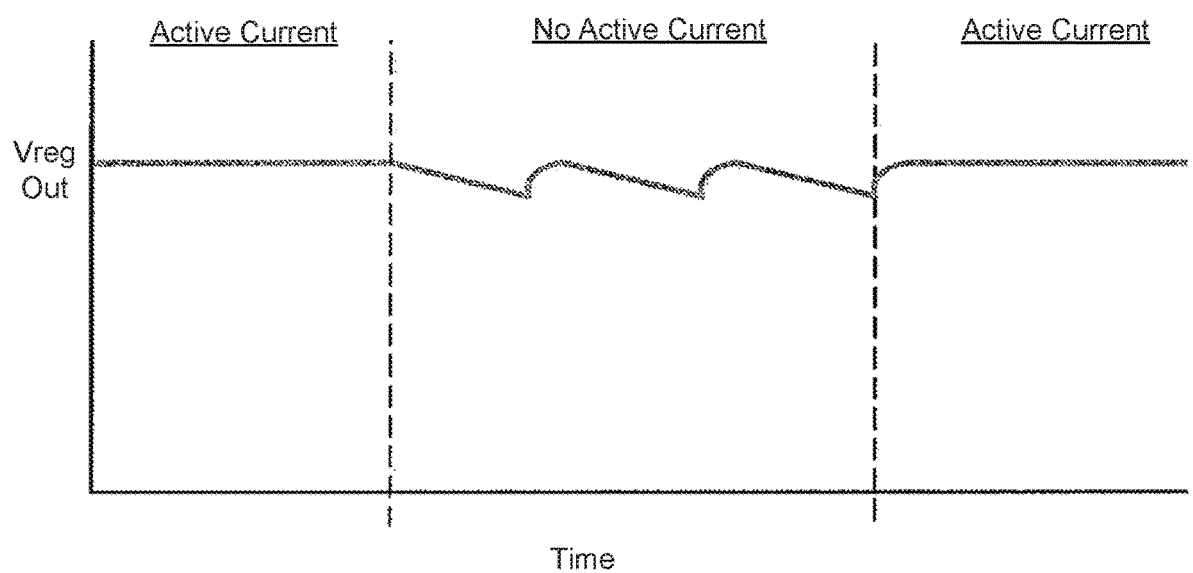
FIG. 6 illustrates an output voltage of a voltage regulator when there is active current consumption at the output voltage versus no active current consumption at the output voltage in accordance with an example.

FIG. 6 illustrates an exemplary output voltage (Vreg Out) of a voltage regulator. When the voltage regulator is turned on and there is active current consumption at the output voltage of the voltage regulator, the output voltage can be stable and constant. After a first period of time, there can be no active current consumption at the output voltage of the voltage regulator, at which point the voltage regulator can start to periodically switch between being turned on for a defined period of time and being turned off for a defined period of time (also referred to as sample and hold). In a specific example, during this time, an active amplifier in the voltage regulator can be turned off and a standby amplifier in the voltage regulator can turn on and off (i.e., sample and hold). During this time, the output voltage can slowly leak when the voltage regulator is turned off for the defined period of time, but upon reaching a defined threshold, the output voltage can quickly increase to a desired value by turning on the voltage regulator for the defined period of time. Therefore, the output voltage does not drop to an undesirable level because the voltage regulator is periodically being turned back on to recharge the output voltage. By switching between turning on and off the voltage regulator, the amount of power consumption can be reduced at the voltage regulator. After a second period of time, the voltage regulator can be turned back on when there is active current consumption at the output voltage of the voltage regulator. However, since the output voltage was only marginally reduced when there was no active current consumption at the output voltage of the voltage regulator, the output voltage can become a stable, regulated output voltage in a relatively short period of time.

Figure 7:
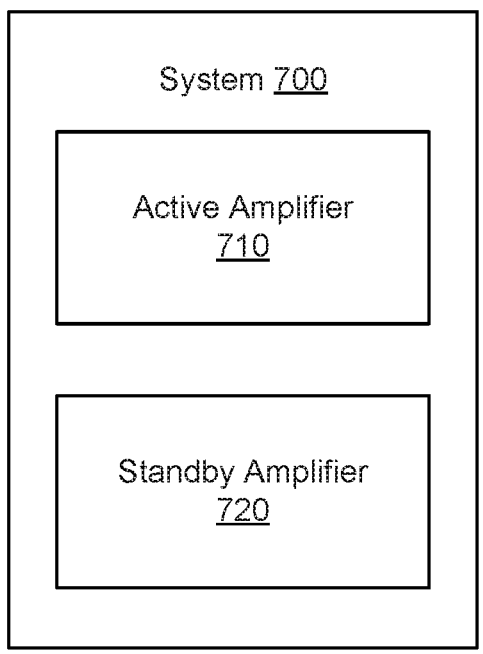
FIG. 7 illustrates a system operable to regulate an output voltage in accordance with an example embodiment.

FIG. 7 illustrates a system 700 operable to regulate an output voltage. The system 700 can include an active amplifier 710 and a standby amplifier 720. The active amplifier 710 can be configured to amplify an input voltage to produce the output voltage when there is active current consumption at the output voltage of the system 700. The standby amplifier 720 can be configured to switch between amplifying the input voltage for a defined period of time and not amplifying the input voltage for a defined period of time to maintain a desired value for the output voltage of the system 700.

Figure 8:
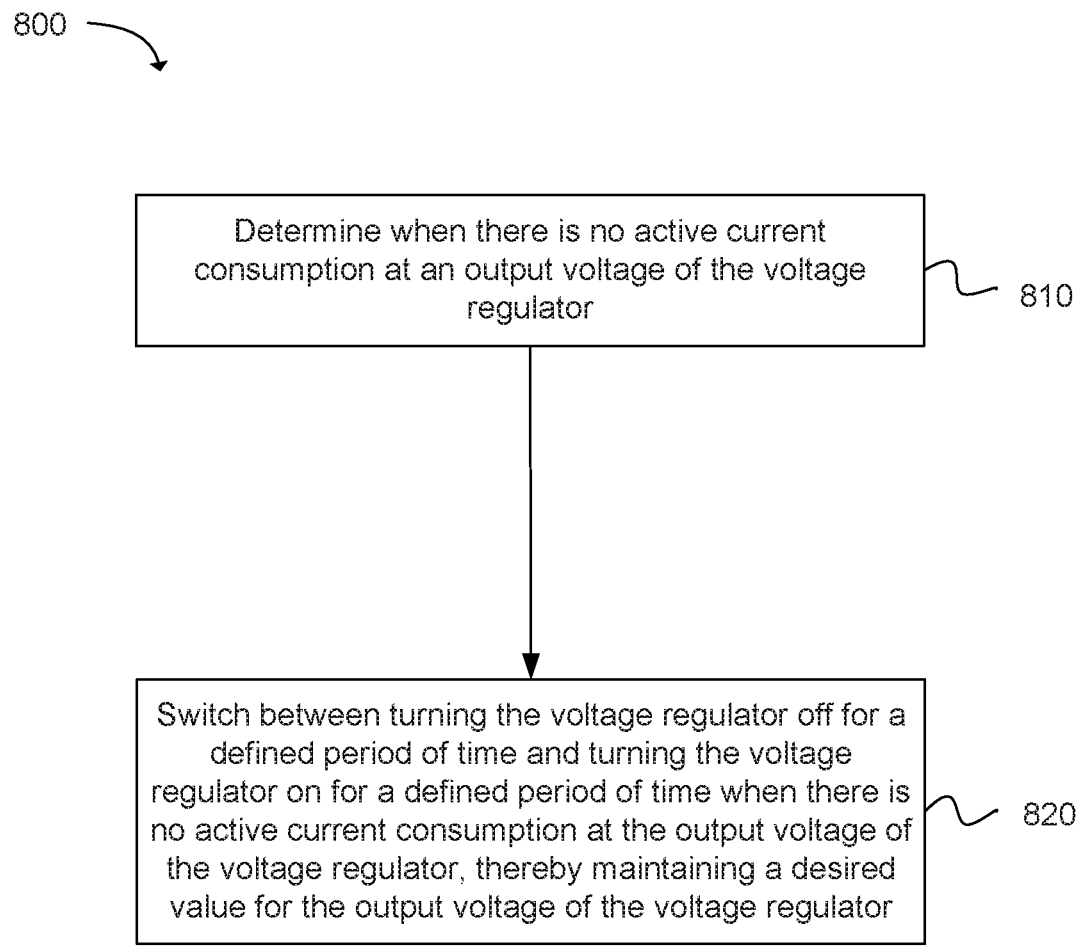
FIG. 8 illustrates functionality of a voltage regulator in accordance with an example embodiment.

FIG. 8 illustrates functionality 800 of a voltage regulator. The voltage regulator can comprise logic to determine when there is no active current consumption at an output voltage of the voltage regulator, as in block 810. The voltage regulator can comprise logic to switch between turning the voltage regulator off for a defined period of time and turning the voltage regulator on for a defined period of time when there is no active current consumption at the output voltage of the voltage regulator, thereby maintaining a desired value for the output voltage of the voltage regulator, as in block 820.

Figure 9:
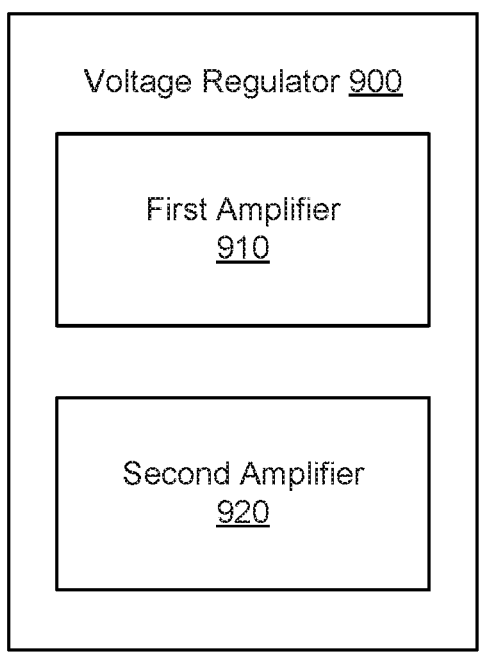
FIG. 9 depicts a voltage regulator comprising a first amplifier and a second amplifier in accordance with an example embodiment.

FIG. 9 illustrates a voltage regulator 900. The voltage regulator 900 can include a first amplifier 910 and a second amplifier 920. The first amplifier 910 can be configured to amplify an input voltage to produce an output voltage when there is active current consumption at an output voltage of the voltage regulator 900. The second amplifier 920 can be configured to switch between amplifying the input voltage for a defined period of time and not amplifying the input voltage for a defined period of time to maintain a desired output voltage at the voltage regulator 900.

Figure 10:
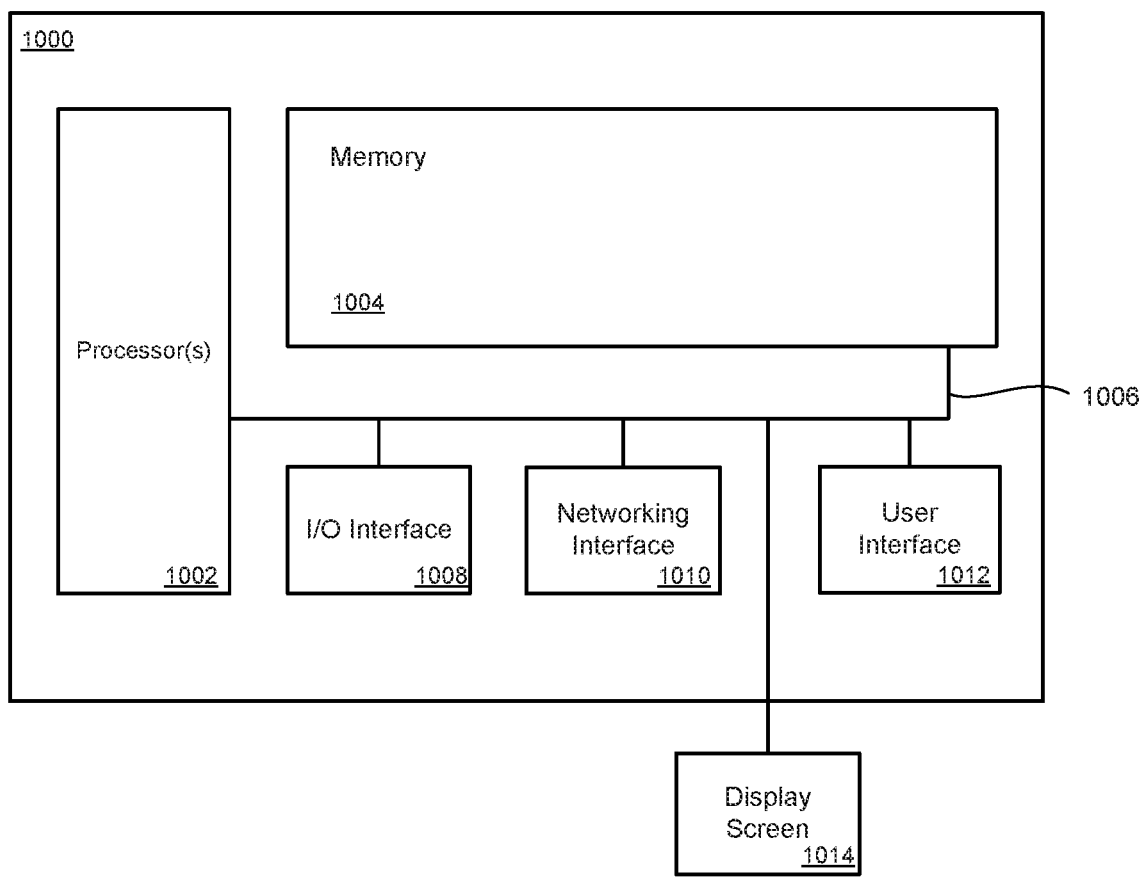
FIG. 10 illustrates a computing system that includes a data storage device in accordance with an example embodiment.

FIG. 10 illustrates a general computing system or device 1000 that can be employed in the present technology. The computing system 1000 can include a processor 1002 in communication with a memory 1004. The memory 1004 can include any device, combination of devices, circuitry, and the like that is capable of storing, accessing, organizing and/or retrieving data. Non-limiting examples include SANs (Storage Area Network), cloud storage networks, volatile or non-volatile RAM, phase change memory, 3D cross point, optical media, hard-drive type media, and the like, including combinations thereof.

The computing system or device 1000 additionally includes a local communication interface 1006 for connectivity between the various components of the system. For example, the local communication interface 1006 can be a local data bus and/or any related address or control busses as may be desired.

The computing system or device 1000 can also include an I/O (input/output) interface 1008 for controlling the I/O functions of the system, as well as for I/O connectivity to devices outside of the computing system 1000. A network interface 1010 can also be included for network connectivity. The network interface 1010 can control network communications both within the system and outside of the system. The network interface can include a wired interface, a wireless interface, a Bluetooth interface, optical interface, and the like, including appropriate combinations thereof. Furthermore, the computing system 1000 can additionally include a user interface 1012, a display device 1014, as well as various other components that would be beneficial for such a system.

The processor 1002 can be a single or multiple processors, and the memory 1004 can be a single or multiple memories. The local communication interface 1006 can be used as a pathway to facilitate communication between any of a single processor, multiple processors, a single memory, multiple memories, the various interfaces, and the like, in any useful combination.

Various techniques, or certain aspects or portions thereof, can take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a RAM, EPROM, flash drive, optical drive, magnetic hard drive, solid state drive, or other medium for storing electronic data. The node and wireless device can also include a transceiver module, a counter module, a processing module, and/or a clock module or timer module. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations. Exemplary systems or devices can include without limitation, laptop computers, tablet computers, desktop computers, smart phones, computer terminals and servers, storage databases, and other electronics which utilize circuitry and programmable memory, such as household appliances, smart televisions, digital video disc (DVD) players, heating, ventilating, and air conditioning (HVAC) controllers, light switches, and the like.

EXAMPLES

The following examples pertain to specific invention embodiments and point out specific features, elements, or steps that can be used or otherwise combined in achieving such embodiments.

In one example there is provided a system operable to regulate an output voltage. The system can comprise an active amplifier configured to amplify an input voltage to produce the output voltage when there is active current consumption at the output voltage of the system. The system can comprise a standby amplifier configured to switch between amplifying the input voltage for a defined period of time and not amplifying the input voltage for a defined period of time to maintain a desired value for the output voltage of the system.

In one example of the system, the standby amplifier is configured to switch between amplifying the input voltage for the defined period of time and not amplifying the input voltage for the defined period of time irrespective of whether there is active current consumption at the output voltage of the system.

In one example of the system, the active amplifier is configured to not amplify the input voltage when there is no active current consumption at the output voltage of the system.

In one example of the system, the active amplifier is inactive when there is no active current consumption at the output voltage of the system and the standby amplifier is active when the active amplifier is active or inactive.

In one example of the system, the standby amplifier is configured to switch between amplifying the input voltage for the defined period of time and not amplifying the input voltage for the defined period of time in accordance with a predefined timing sequence.

In one example of the system, the standby amplifier is configured to switch between amplifying the input voltage for the defined period of time and not amplifying the input voltage for the defined period of time when the output voltage of the system drops to below a defined threshold.

In one example of the system, the standby amplifier is configured to amplify the input voltage for the defined period of time to mitigate current leakage that has reduced the output voltage of the system when the active amplifier is inactive.

In one example of the system, the standby amplifier is configured to switch between amplifying the input voltage for the defined period of time and not amplifying the input voltage for the defined period of time to reduce a power consumption of the system.

In one example of the system, the active amplifier is associated with a first gain level and the standby amplifier is associated with a second gain level.

In one example of the system, the active amplifier is configured to amplify the input voltage to produce the output voltage when there is an active load current at the output voltage of the system; and the active amplifier is configured to not amplify the input voltage to produce the output voltage when there is no active load current at the output voltage of the system.

In one example there is provided a voltage regulator. The voltage regulator can comprise logic to determine when there is no active current consumption at an output voltage of the voltage regulator. The voltage regulator can comprise logic to switch between turning the voltage regulator off for a defined period of time and turning the voltage regulator on for a defined period of time when there is no active current consumption at the output voltage of the voltage regulator, thereby maintaining a desired value for the output voltage of the voltage regulator.

In one example of the voltage regulator, the logic is configured to switch between turning the voltage regulator off for the defined period of time and turning the voltage regulator on for the defined period of time when there is no active current consumption at the output voltage of the voltage regulator in accordance with a predefined timing sequence.

In one example of the voltage regulator, the logic is configured to switch between turning the voltage regulator off for the defined period of time and turning the voltage regulator on for the defined period of time when the output voltage of the voltage regulator drops to below a defined threshold.

In one example of the voltage regulator, the logic is configured to turn the voltage regulator on for the defined period of time to mitigate current leakage that has reduced the output voltage of the voltage regulator when the voltage regulator is turned off for the defined period of time.

In one example of the voltage regulator, the logic is configured to: determine when there is active current consumption at the output voltage of the voltage regulator; and turn the voltage regulator on when there is active current consumption at the output voltage of the voltage regulator.

In one example of the voltage regulator, the logic is configured to switch between turning the voltage regulator off for the defined period of time and turning the voltage regulator on for the defined period of time when there is no active current consumption at the output voltage of the voltage regulator to reduce a power consumption of the voltage regulator.

In one example of the voltage regulator, the logic is configured to: turn the voltage regulator on while there is active current consumption at the output voltage of the voltage regulator in accordance with an active mode of the voltage regulator; or switch between turning the voltage regulator off for the defined period of time and turning the voltage regulator on for the defined period of time when there is no active current consumption at the output voltage of the voltage regulator in accordance with a standby mode of the voltage regulator.

In one example of the voltage regulator, the voltage regulator is included in a memory device.

In one example there is provided a voltage regulator, comprising: a first amplifier configured to amplify an input voltage to produce an output voltage when there is active current consumption at an output voltage of the voltage regulator; and a second amplifier configured to switch between amplifying the input voltage for a defined period of time and not amplifying the input voltage for a defined period of time to maintain a desired output voltage at the voltage regulator.

In one example of the voltage regulator, the second amplifier is configured to switch between amplifying the input voltage for the defined period of time and not amplifying the input voltage for the defined period of time irrespective of whether there is active current consumption at the output voltage of the voltage regulator.

In one example of the voltage regulator, the first amplifier is configured to not amplify the input voltage when there is no active current consumption at the output voltage of the voltage regulator.

In one example of the voltage regulator, the first amplifier is inactive when there is no active current consumption at the output voltage of the voltage regulator and the second amplifier is active when the first amplifier is active or inactive.

In one example of the voltage regulator, the second amplifier is configured to switch between amplifying the input voltage for the defined period of time and not amplifying the input voltage for the defined period of time in accordance with a predefined timing sequence.

In one example of the voltage regulator, the second amplifier is configured to switch between amplifying the input voltage for the defined period of time and not amplifying the input voltage for the defined period of time when the output voltage of the voltage regulator drops to below a defined threshold.

In one example of the voltage regulator, the second amplifier is configured to amplify the input voltage for the defined period of time to mitigate current leakage that has reduced the output voltage of the voltage regulator when the first amplifier is inactive.

In one example of the voltage regulator, the second amplifier is configured to switch between amplifying the input voltage for the defined period of time and not amplifying the input voltage for the defined period of time to reduce a power consumption of the voltage regulator.

In one example of the voltage regulator, the first amplifier is associated with a first gain level and the second amplifier is associated with a second gain level.

In one example there is provided a method for regulating an output voltage in a voltage regulator. The method can comprise determining, at the voltage regulator, when there is no active current consumption at an output voltage of the voltage regulator. The method can comprise switching between turning the voltage regulator off for a defined period of time and turning the voltage regulator on for a defined period of time when there is no active current consumption at the output voltage of the voltage regulator, thereby maintaining a desired value for the output voltage of the voltage regulator.

In one example of the method for regulating the output voltage in the voltage regulator, the method can comprise switching between turning the voltage regulator off for the defined period of time and turning the voltage regulator on for the defined period of time when there is no active current consumption at the output voltage of the voltage regulator in accordance with a predefined timing sequence.

In one example of the method for regulating the output voltage in the voltage regulator, the method can comprise switching between turning the voltage regulator off for the defined period of time and turning the voltage regulator on for the defined period of time when the output voltage of the voltage regulator drops to below a defined threshold.

In one example of the method for regulating the output voltage in the voltage regulator, the method can comprise turning the voltage regulator on for the defined period of time to mitigate current leakage that has reduced the output voltage of the voltage regulator when the voltage regulator is turned off for the defined period of time.

In one example of the method for regulating the output voltage in the voltage regulator, the method can comprise: determining when there is active current consumption at the output voltage of the voltage regulator; and turning the voltage regulator on when there is active current consumption at the output voltage of the voltage regulator.

In one example of the method for regulating the output voltage in the voltage regulator, the method can comprise switching between turning the voltage regulator off for the defined period of time and turning the voltage regulator on for the defined period of time when there is no active current consumption at the output voltage of the voltage regulator to reduce a power consumption of the voltage regulator.

In one example of the method for regulating the output voltage in the voltage regulator, the method can comprise: turning the voltage regulator on while there is active current consumption at the output voltage of the voltage regulator in accordance with an active mode of the voltage regulator; or switching between turning the voltage regulator off for the defined period of time and turning the voltage regulator on for the defined period of time when there is no active current consumption at the output voltage of the voltage regulator in accordance with a standby mode of the voltage regulator.

While the forgoing examples are illustrative of the principles of invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A system operable to regulate an output voltage, the system comprising:
   an active amplifier configured to amplify an input voltage to produce the output voltage when there is active current consumption at the output voltage of the system and configured to not amplify the input voltage when there is no active current consumption at the output voltage of the system; and
   a standby amplifier configured to switch between amplifying the input voltage for a defined period of time and not amplifying the input voltage for a defined period of time to maintain a desired value for the output voltage of the system, wherein the standby amplifier is configured to amplify the input voltage for the defined period of time to mitigate current leakage that reduces the output voltage of the system when the active amplifier is inactive; and
   wherein the standby amplifier is further configured to switch either:
      irrespective of whether there is active current consumption at the output voltage;
      in accordance with a predefined timing sequence; or
      when the output voltage of the system drops to below a defined threshold.

2. The system of claim 1, wherein the active amplifier is inactive when there is no active current consumption at the output voltage of the system and the standby amplifier is active when the active amplifier is active or inactive.

3. The system of claim 1, wherein the standby amplifier is configured to switch between amplifying the input voltage for the defined period of time and not amplifying the input voltage for the defined period of time to reduce a power consumption of the system.

4. The system of claim 1, wherein the active amplifier is associated with a first gain level and the standby amplifier is associated with a second gain level.

5. The system of claim 1, wherein:
   the active amplifier is configured to amplify the input voltage to produce the output voltage when there is an active load current at the output voltage of the system; and
   the active amplifier is configured to not amplify the input voltage to produce the output voltage when there is no active load current at the output voltage of the system.

6. A voltage regulator, comprising logic to:
   determine when there is no active current consumption at an output voltage of the voltage regulator and determine when there is active current consumption at the output voltage of the voltage regulator; and
   switch between turning the voltage regulator off for a defined period of time and turning the voltage regulator on for a defined period of time when there is no active current consumption at the output voltage of the voltage regulator to maintain a desired value for the output voltage of the voltage regulator, wherein the logic is configured to turn the voltage regulator on for the defined period of time to mitigate current leakage that reduces the output voltage of the voltage regulator when the voltage regulator is turned off for the defined period of time, or to turn the voltage regulator on when there is active current consumption at the output voltage of the voltage regulator; and
   wherein the voltage regulator is included in a memory device.

7. The voltage regulator of claim 6, wherein the logic is configured to switch between turning the voltage regulator off for the defined period of time and turning the voltage regulator on for the defined period of time when there is no active current consumption at the output voltage of the voltage regulator in accordance with a predefined timing sequence.

8. The voltage regulator of claim 6, wherein the logic is configured to switch between turning the voltage regulator off for the defined period of time and turning the voltage regulator on for the defined period of time when the output voltage of the voltage regulator drops to below a defined threshold.

9. The voltage regulator of claim 6, wherein the logic is configured to switch between turning the voltage regulator off for the defined period of time and turning the voltage regulator on for the defined period of time when there is no active current consumption at the output voltage of the voltage regulator to reduce a power consumption of the voltage regulator.

10. The voltage regulator of claim 6, wherein the logic is configured to:
    turn the voltage regulator on while there is active current consumption at the output voltage of the voltage regulator in accordance with an active mode of the voltage regulator; or
    switch between turning the voltage regulator off for the defined period of time and turning the voltage regulator on for the defined period of time when there is no active current consumption at the output voltage of the voltage regulator in accordance with a standby mode of the voltage regulator.

* * * * *